United States Patent
Arnold et al.

(10) Patent No.: US 8,518,824 B2
(45) Date of Patent: Aug. 27, 2013

(54) SELF ALIGNING VIA PATTERNING

(75) Inventors: John Christopher Arnold, North Chatham, NY (US); Sean D. Burns, Hopewell Junction, NY (US); Sivananda K. Kanakasabapathy, Niskayuna, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/558,441

(22) Filed: Jul. 26, 2012

(65) Prior Publication Data
US 2012/0302057 A1    Nov. 29, 2012

Related U.S. Application Data

(63) Continuation of application No. 13/118,034, filed on May 27, 2011, now Pat. No. 8,298,943.

(51) Int. Cl.
*H01L 21/311*    (2006.01)
*H01L 21/44*    (2006.01)
*H01L 21/00*    (2006.01)

(52) U.S. Cl.
USPC ........... 438/667; 438/694; 438/704; 438/734; 438/669; 438/672; 257/E21.002

(58) Field of Classification Search
USPC .................................................. 438/584–688
See application file for complete search history.

(56) References Cited

U.S. PATENT DOCUMENTS

| | | | |
|---|---|---|---|
| 4,799,990 A | 1/1989 | Kerbaugh et al. | |
| 5,825,076 A | 10/1998 | Kotvas et al. | |
| 6,150,256 A * | 11/2000 | Furukawa et al. | 438/618 |
| 6,514,805 B2 | 2/2003 | Xu et al. | |
| 6,777,260 B1 * | 8/2004 | Chen | 438/95 |
| 7,160,799 B2 * | 1/2007 | Lytle et al. | 438/637 |
| 7,375,009 B2 | 5/2008 | Chua et al. | |
| 7,470,616 B1 | 12/2008 | Akinmade-Yusuff et al. | |
| 7,692,250 B2 * | 4/2010 | Booth et al. | 257/369 |
| 7,767,386 B2 | 8/2010 | Dunn | |
| 7,879,727 B2 | 2/2011 | Postnikov et al. | |

(Continued)

OTHER PUBLICATIONS

Notice of Allowance for U.S. Appl. No. 13/118,034, dated Jul. 30, 2012.

(Continued)

*Primary Examiner* — Mohsen Ahmadi
*Assistant Examiner* — Evren Seven
(74) *Attorney, Agent, or Firm* — Jason Sosa; Catherine Ivers

(57) ABSTRACT

A method for patterning self-aligned vias in a dielectric. The method includes forming a first trench partially through a hard mask, where the trench corresponds to a desired wiring path in the dielectric. The trench should be formed on a sub-lithographic scale. Then, form a second trench, also of a sub-lithographic scale, that intersects the first trench. The intersection forms a pattern extending through the depth of the hard mask, and corresponds to a via hole in the dielectric. The via hole is etched into the dielectric through the hard mask. Then the first trench is extended through the hard mask and the exposed area is etched to form the wiring path, which intersects the via hole. Conductive material is deposited to form a sub-lithographic via and wiring. This method may be used to form multiple vias of sub-lithographic proportions and with a sub-lithographic pitch.

10 Claims, 8 Drawing Sheets

(56) References Cited

U.S. PATENT DOCUMENTS

| | | | |
|---|---|---|---|
| 7,968,506 B2* | 6/2011 | Chou et al. ................... | 510/175 |
| 8,298,935 B2* | 10/2012 | Chen et al. ................... | 438/636 |
| 2006/0273385 A1* | 12/2006 | Hshieh ........................ | 257/330 |
| 2007/0163887 A1* | 7/2007 | Hofmann ..................... | 205/80 |
| 2008/0286971 A1* | 11/2008 | Doris et al. .................. | 438/694 |
| 2011/0130007 A1 | 6/2011 | Ching et al. | |
| 2012/0302056 A1* | 11/2012 | Chen et al. ................... | 438/636 |

OTHER PUBLICATIONS

Non Final Office Action for U.S. Appl. No. 13/118,034, dated May 29, 2012.

Response to Non Final Office Action for U.S. Appl. No. 13/118,034, dated Jul. 10, 2012, filed Jul. 11, 2012.

* cited by examiner

SELF ALIGNING VIA PATTERNING

RELATED APPLICATIONS

This application is a continuation of application Ser. No. 13/118,034, filed on May 27, 2011, now pending.

BACKGROUND OF THE INVENTION

1. Field of Technology:

This disclosure relates generally to integrated circuit design, and more specifically to the formation of sub-lithographic vias and wiring trenches in metallization layers of a semiconductor chip.

2. Description of the Related Art:

In the fabrication/manufacture of integrated circuit chips, there is a growing desire to fit more devices and circuits within each chip. As such, there is a constant need to not only reduce the size of the circuit components, but also to reduce the size of wiring and connecting vias interconnected to the circuit components and the spacing (pitch) between one via (and connecting wire) to another via (and connecting wire) on the same level. These wires and vias may be disposed of in one or more metallization layers formed on top of a semiconductor substrate.

The semiconductor substrate is preferably made up of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate may also be made up of other semiconductor materials, such as germanium, and compound semiconductor substrates, such as type III/V semiconductor substrates, e.g., GaAs. Although the semiconductor substrate is often depicted as a bulk semiconductor substrate, semiconductor on insulator (SOI) substrate arrangements, such as silicon on insulator substrates, are also suitable substrates for use in an integrated circuit chip.

The substrate may include one or more circuit components or devices, such as transistors, capacitors, or resistors formed thereon. Other types may be used.

A metallization layer is wiring (conductive lines) embedded in a dielectric material. Multiple metallization layers are often put together and interconnected through conventional vias, which pass through dielectric material to contact metal wires on separate levels. A metallization layer may also be referred to herein as a metal layer, a wiring layer, or a wiring level. These layers together may be called the interconnect structure or the Back End of Line (BEOL) wiring levels.

A dielectric layer may include both an upper portion, i.e., the dielectric material in which wiring is formed, and a lower portion, i.e., the dielectric material in which conductive vias are formed. The lower portion serves as an inter-level dielectric (ILD) layer while the upper portion serves as an intra-metal dielectric (IMD) layer. The dielectric layer can be a single layer or a multi-layered stack. For example, a single layer can be used to serve as both the ILD and IMD or separate layers are used for the ILD and IMD. In another example, an etch stop layer can be disposed between the ILD and IMD.

The conductive material used to create the wiring (conductive lines) may be a metal, such as tungsten, copper, aluminum, respective alloys, or combinations thereof. Conductive vias may be made up of the same or different materials from the wiring. Vias may connect the conductive line to contact regions below. Depending on the dielectric layer level, the contact region can be another conductive line in a lower dielectric layer or the contact region can be a device, such as a diffusion region, a gate of a transistor, or a plate of a capacitor.

Wiring and vias are typically made using photo lithography processing. In conventional photo lithography processing, a photo resistant masking material (photoresist) is disposed over one or more layers of a dielectric material. A masking step is performed to selectively remove photo resist material from certain regions (i.e., via hole locations and wiring paths) of the dielectric material, which are left exposed. An etch process follows, which etches away the exposed portions of the dielectric material forming trenches and via holes therein. A metal deposition process fills these portions with conductive material to form the wiring and vias of a layer.

More specifically, the masking step performed involves focusing light, through a mask image, onto the surface of the photo resist layer. Due to focusing and light wavelength constraints, there is a limitation on how small an image can be formed.

To create wiring and vias with smaller critical dimensions (CD), less than 40 nm for example, and tighter pitches, less than 80 nm for example, the mask images must be created on a sub-lithographic scale (i.e., of a size smaller than can be produced using conventional lithographic processes). In addition, smaller CD and tighter grouping allow for little error in forming the vias and connecting wires. As such, it would also be desirable to have a process where vias self-align themselves to their respective metal lines during their creation.

SUMMARY

One aspect of the present invention discloses a method for patterning self-aligned vias in a dielectric. The method includes forming a hard mask on top of the dielectric. The method further includes forming a first trench within the hard mask, wherein the first trench is of a depth less than an entire depth of the hard mask. Then form a second trench within the hard mask to intersect at least a portion of the first trench, wherein the intersection of the first and second trench creates a hole pattern extending through the hard mask to expose an area of the dielectric. Etch the exposed area of the dielectric through the hole pattern to create a via hole extending through the dielectric, or partially through the dielectric. Extend the depth of the first trench, with an etch, through the hard mask, to expose an area of the dielectric corresponding to the first trench and intersecting the via hole. Etch the exposed area of the dielectric corresponding to the first trench to create a wiring path in the dielectric wherein the wiring path extends less than an entire depth of the dielectric and intersects the via hole, and etch vias through the entire dielectrics and a dielectric cap layer and land on the metal contact underneath. Finally, perform a metal deposition, wherein both the via hole and the wiring path are filled with a conductive material to form a metal layer.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1:
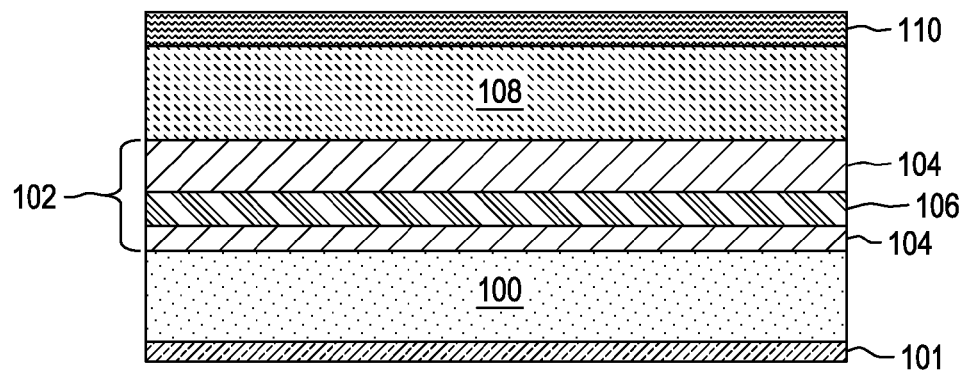
FIG. 1 illustrates a plurality of layers formed on top of a dielectric layer to be used for etching the desired patterns into the dielectric layer in accordance with an embodiment of the present invention.

Detailed embodiments of the claimed methods and structures are disclosed herein with reference to the accompanying drawings; however, it is to be understood that the disclosed embodiments are merely illustrative of potential embodiments of the present invention and may take various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Embodiments of the present invention describe an improved technique for etching via holes and wiring paths into a dielectric layer wherein the via holes self-align to the wiring paths.

A preferred embodiment includes using a trench-first metal hard mask (TFMHM) sequence wherein a sub-lithographic trench (corresponding to the wiring path) is etched into the hard mask through a sidewall image transfer technique. This is followed by the via hole being etched into the hard mask by etching a second sub-lithographic trench to intersect the first trench at the desired location of the via hole, wherein the intersection of the two trenches extends through the hard mask. In one embodiment, the two sets of trenches are perpendicular to each other. The intersection in the hard mask may then be used to etch the via hole (having the sub-lithographic boundaries of the intersection) into the dielectric layer. The first trench in the hard mask is then extended through the depth of the hard mask and subsequently used to etch the wiring path trench into the dielectric layer.

FIG. 1 illustrates a plurality of layers formed on top of a dielectric layer to be used for etching the desired patterns into the dielectric layer in accordance with an embodiment of the present invention. Dielectric layer 100 is made up of dielectric material.

Dielectric material is an insulating material or a combination of insulating materials. Such materials may include, in a non-exhaustive list, silicon oxide, doped silicon oxide, such as fluorinated silicon oxide (FSG), undoped or doped silicate glasses, such as boron phosphate silicate glass (BPSG) and phosphate silicate glass (PSG), undoped or doped thermally grown silicon oxide, undoped or doped TEOS deposited silicon oxide, and low-k or ultra low-k dielectric materials, such as organo-silicate glass (OSG) and porous low-k materials. Dielectric layer 100 may have an upper portion IMD and a lower portion ILD. In a preferred embodiment, dielectric layer 100 is one single continuous layer. In another embodiment, dielectric layer 100 may contain a plurality of dielectric layers.

Dielectric layer 100 may be positioned on top of a substrate (not shown) or another dielectric layer (not shown). Wiring paths and via holes will be etched in dielectric layer 100.

A lower etch stop 101 may be provided beneath dielectric layer 100. The lower etch stop layer 101 can contain various types of materials. In one embodiment, the lower etch stop layer 101 is a dielectric material. The lower etch stop layer 101, in another embodiment, is a nitrogen doped BLOK (NBLOK) or low k NBLOK. Other types of etch stop materials, such as silicon nitride, may be used.

Hard mask 102 is formed on top of dielectric layer 100. A hard mask is often used as an etch mask and sometimes as an implant mask. In this case, hard mask 102 protects the underlying surface from attack by the etchant chemicals, and only exposed surfaces are etched away. A hard mask substitutes for photoresist in instances where the resist is unable to do the job required by the process. For example, during plasma etching, a pattern in a photoresist may be rapidly degraded. The problem with using a photoresist as the etch mask for a trench etch is two-fold: (1) the resist may be etched away before the trenches are completed; (2) the trenches may be covered with organic (carbon-based) chemical deposits that could contaminate the devices.

Hard mask 102 is preferably a metal hard mask made up of Titanium Nitride (TiN) layer 106 and TEOS (Tetraethyl Orthosilicate) layers 104 on both the top and bottom sides of TiN layer 106. TEOS is a precursor to a silicon oxide, and TEOS layers 104 protect damage to dielectric material and may also be sacrificial when etching hard mask 102. In other embodiments, TEOS layers 104 may be replaced with any oxide material.

In another embodiment, hard mask 102 may be made up of silicon nitride, silicon dioxide, silicon carbide, silicon carbide nitride and combinations of the preceding.

Hard mask 102 may be deposited using chemical vapor deposition (CVD) processes, or physical vapor deposition (PVD).

To etch desired patterns into hard mask 102, a process may use a photoresist. However, a single layer is often not enough to hold the shape of the patterns as they are etched into hard mask 102. As such, multi-layer lithography is the preferred embodiment. Using this process, a photoresist, made up of a light-sensitive material, may be thinner and, hence, a smaller feature size may be achieved using conventional photo-lithography techniques. However, in order to generate a mask layer of sufficient thickness for the ensuing primary etch process, additional material layers are formed underlying the photoresist. The pattern, formed in the photoresist using lithographic techniques, is transferred to the underlying layer or layers. In the preferred embodiment, developable organic planarization layer (OPL) 108 is formed on top of hard mask 102 and developable anti-reflective coating (ARC) layer 110 is formed on top of OPL 108. A photoresist may be formed upon ARC layer 110.

The developable OPL layer 108 can include a photo-sensitive organic polymer made up of a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the developable OPL layer 108 may be made up of any organic polymer and a photo-active compound having a molecular structure that can attach to the molecular structure of the organic polymer. The fabrication of a photo-sensitive organic polymer is understood to one skilled in the art of organic chemistry or polymer chemistry. Furthermore, the developable OPL layer 108 is selected to be compatible with the overlying developable ARC layer 110, any overlying photo-resist layer, and the lithographic wavelength, i.e., ArF, KrF, etc. The developable OPL layer 108 may, for example, be applied using spin coating technology.

The developable ARC layer 110 possesses material properties suitable for use as an anti-reflective coating. Additionally, the developable ARC layer 110 is made up of a light-sensitive material that, when exposed to electromagnetic (EM) radiation, is chemically altered and thus configured to be removed using a developing solvent. For example, the developable ARC layer 110 may contain (wet) developable anti-reflective coatings. Additionally, the developable ARC layer 110 is selected to be compatible with an overlying photo-resist layer and the lithographic wavelength, i.e., ArF, KrF, etc. The developable ARC layer 110 may, for example, be applied using spin coating technology.

In other embodiments, the ARC and OPL layers may be non-photosensitive.

Figure 2A:
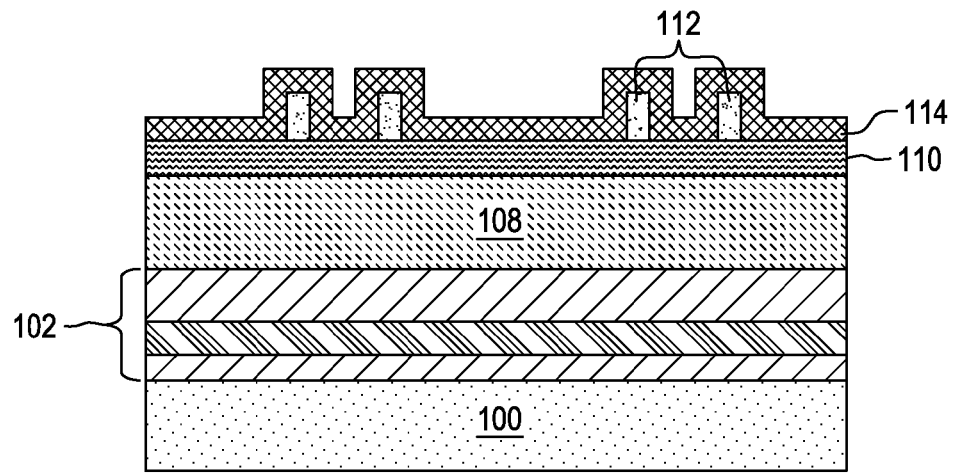
FIG. 2A depicts photoresist patterning and conformal layer deposition in accordance with an illustrative embodiment.

FIG. 2A depicts photoresist patterning and conformal layer deposition in accordance with an illustrative embodiment. Photoresist 112 is etched through a photo-lithograpy process to form a pattern which may be subsequently transferred into ARC layer 110, OPL 108, and ultimately into hard mask 102. In a preferred embodiment, photoresist 112 is patterned to form mandrels about which conformal layer 114 may be deposited. Conformal layer 114 is preferably a low-temperature oxide, but may also be a nitride material in other embodiments. Conformal layer 114 is formed over the entire surface of the semiconductor structure. Conformal layer 114 should be "conformal" in the sense that the material is deposited with equal thickness on all exposed surfaces, and especially on sidewalls of the patterned photoresist 112. Any of the well known conformal deposition methods and material can be used, for example, a low-temperature oxide may be deposited by CVD. In other embodiments, conformal layer 114 may be deposited through atomic layer deposition method (ALD) or quasi ALD processes.

Figure 2B:
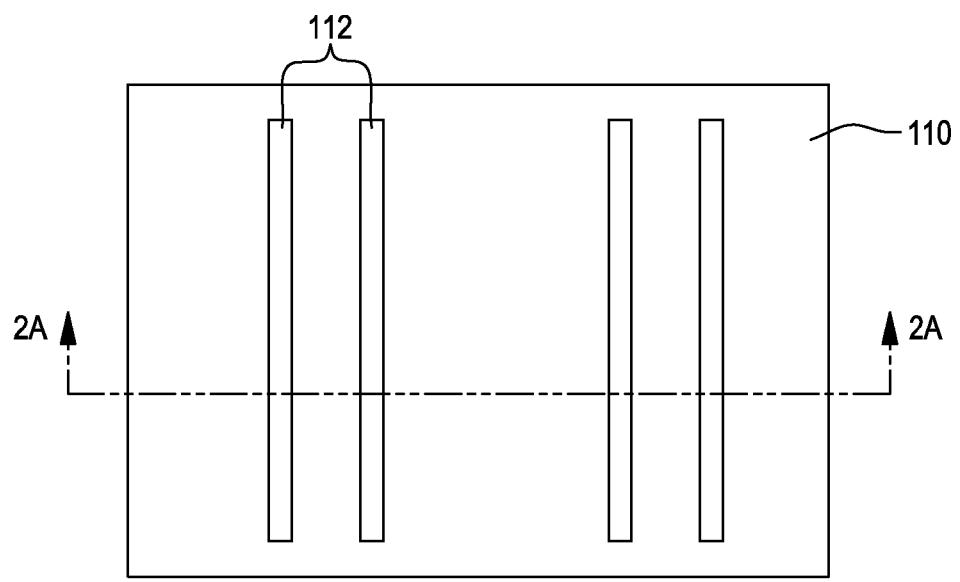
FIG. 2B illustrates the photoresist patterning of FIG. 2A from a top down view.

FIG. 2B illustrates the photoresist patterning of FIG. 2A from a top down view. Photoresist 112 forms long raised mandrel formations above ARC layer 110. Conformal layer 114 is not shown in this depiction.

Figure 3:
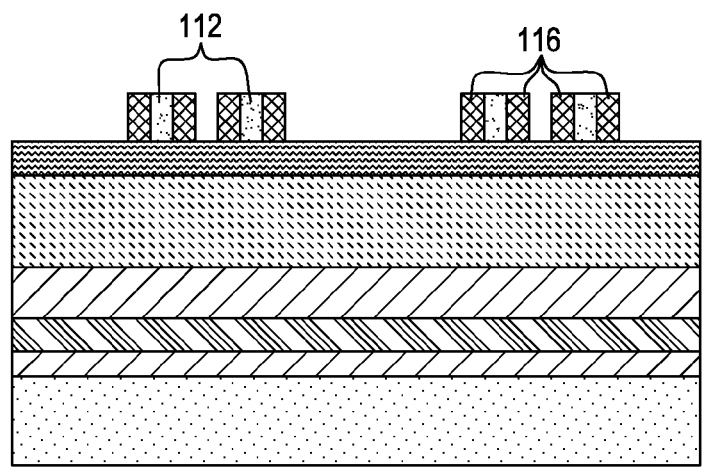
FIG. 3 depicts sidewall spacer formation in accordance with an illustrative embodiment.

FIG. 3 depicts sidewall spacer formation in accordance with an illustrative embodiment. The sidewalls of patterned photoresist 112 should have minimal sidewall tapering; or more accurately, are preferred to be perpendicular to the semiconductor structure surface.

Once the conformal layer 114 has been deposited, an anisotropic etch is performed. The etch is "anisotropic" in the sense that the etch has a directional preference in attacking the horizontal portions of conformal layer 114 while leaving vertical portions thereof undisturbed. The result of the anisotropic etch is sidewall spacers 116. This process is known in the art as a "sidewall image transfer."

Figure 4A:
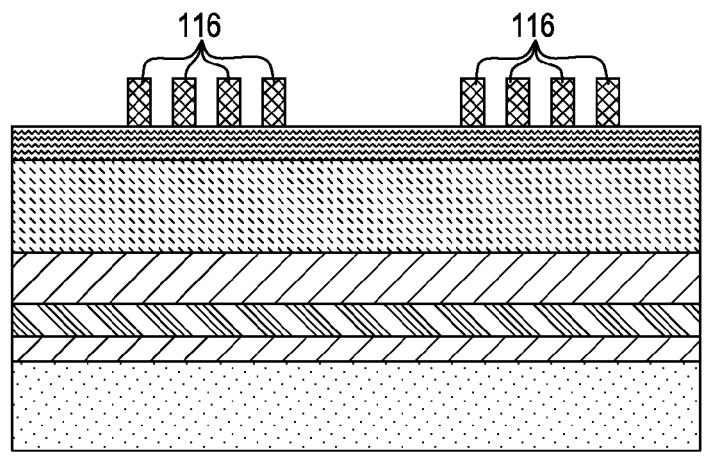
FIG. 4A illustrates the sidewall spacers subsequent to photoresist removal in accordance with an embodiment of the present invention.

FIG. 4A illustrates the sidewall spacers subsequent to photoresist (left as mandrels) removal in accordance with an embodiment of the present invention. In other embodiments, instead of using patterned photoresist 112 as mandrels about which to deposit conformal layer 114, other materials, such as amorphous carbon, amorphous silicon, etc., may be used. Here, what was left of photoresist 112 is removed, leaving the raised sidewall spacers 116 across a surface of the semiconductor structure.

The width of sidewall spacers 116 is determined by the thickness of conformal layer 114. Deposition techniques allow a designer to be highly selective in the thickness of conformal layer 114, and hence the width of sidewall spacers 116 (i.e., a designer can choose the thickness of sidewall spacers 116). If trenches defined by patterned photoresist 112 are at the limits of photolithographic resolution, adding sidewall spacers with such exactness allows the trenches to be reduced to a sub-lithographic scale. For example, a trench pattern may now be defined by the distance between two sidewall spacers 116, which is two times the width of the spacer less than the smallest resolution for a lithographic trench pattern. Alternatively, a mask layer may be formed around the sidewall spacers 116, and then the sidewall spacers 116 removed to form trench patterns equal to the width of the sidewall spacer itself. In this way, the patterns can be reversed (tone inverted).

Sidewall image transfer is only one method which may be used to create trenches with sub-lithographic widths. In other embodiments, other advanced patterning techniques may be used. Such techniques may include both pitch splitting with tone inversion and pitch splitting with negative tone development.

Figure 4B:
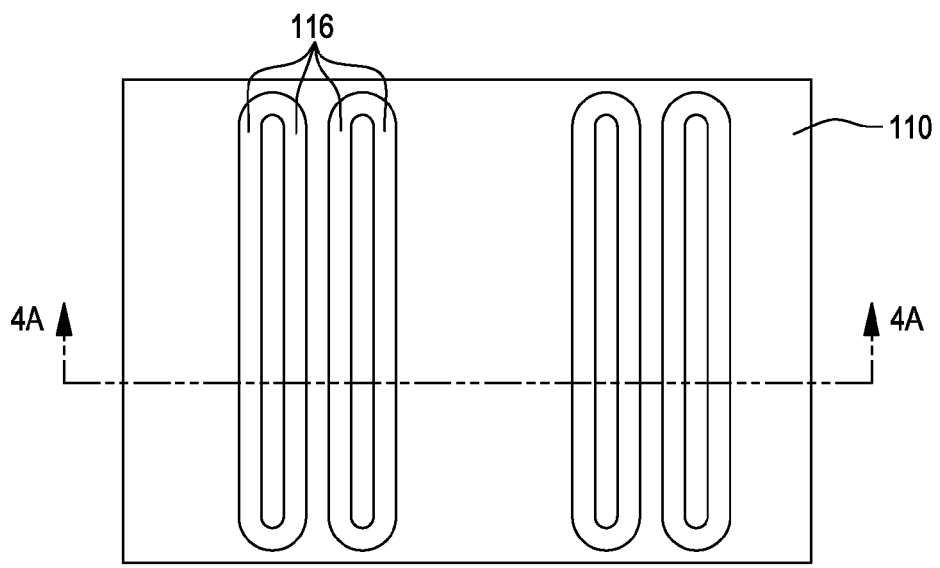
FIG. 4B depicts sidewall spacers of FIG. 4A from a top down view.

FIG. 4B depicts sidewall spacers of FIG. 4A from a top down view. Now sidewall spacers 116 form raised structures across ARC layer 110.

Figure 5:
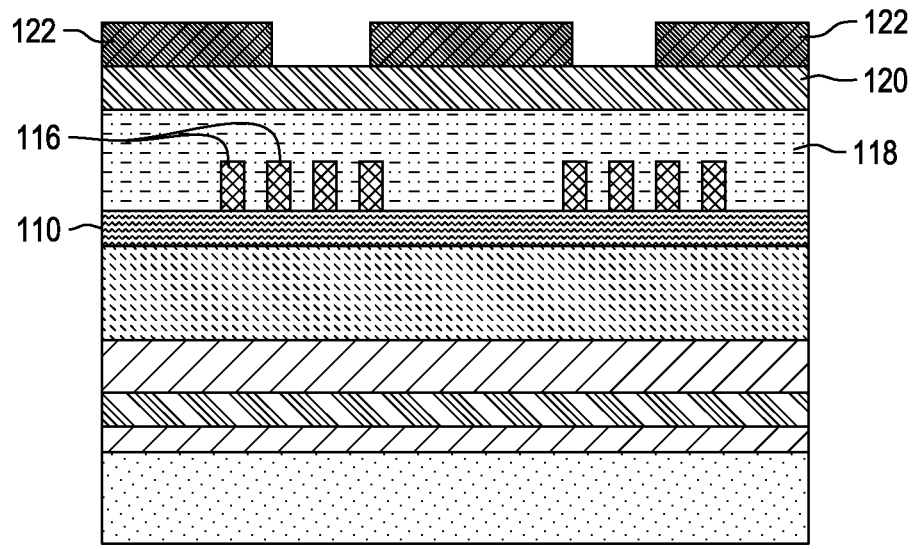
FIG. 5 illustrates the forming of blocking lithography in accordance with an embodiment of the present invention.

FIG. 5 illustrates the forming of blocking lithography in accordance with an embodiment of the present invention. In a preferred embodiment, on top of ARC layer 110 and sidewall spacers 116 a new OPL 118 is formed, followed by a new ARC layer 120 formed on OPL 118. On top of ARC layer 120, a new photoresist 122 may be patterned.

Referring back to FIG. 4B, it is the spaces in between sidewall spacers 116 that will form the trenches in the masking layers and ultimately the dielectric layer. However, as seen from this top view, if an etch were to take place using this mask, not all the trenches would not have ending points and one may connect to another. Patterned photoresist 122 of FIG. 5 blocks any unnecessary features, such as the outermost encircling trench, and may also cut long lines into shorter ones.

For example, it can be seen that patterned photoresist 122 blocks the leftmost and rightmost edge beneath photoresist 122. In a preferred embodiment, this would continue around the entirety of the shown semiconductor structure surface. In addition, patterned photoresist 122 blocks the leftmost and rightmost spaces in between sidewall spacers 116, as well as a larger region in the center of the cross-section. This may cut the trenches short so that from this cross-section view they will not be seen, or may eliminate them altogether.

Figure 6:
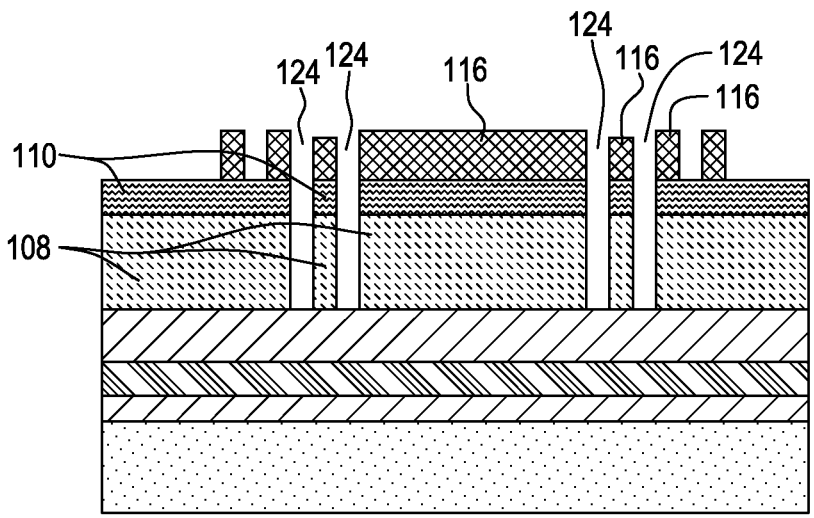
FIG. 6 depicts trenches etched through the OPL and ARC layer in accordance with an illustrative embodiment.

FIG. 6 depicts trenches 124 etched through OPL 108 and ARC layer 110. Trenches 124 are defined by the spaces between sidewall spacers 116, as seen through patterned photoresist 122. Once the trenches have been etched, the new OPL 118, new ARC layer 120, and new patterned photoresist 122, may be removed.

Figure 7:
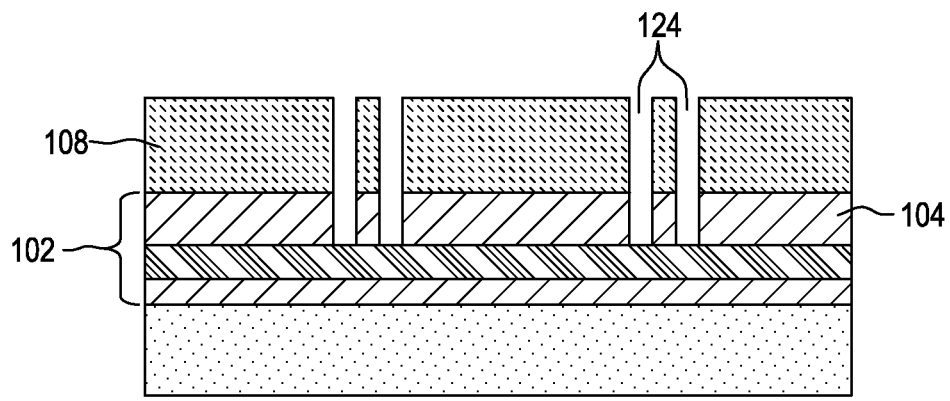
FIG. 7 shows the trenches extended into an upper portion of the hard mask in accordance with an illustrative embodiment.

FIG. 7 shows trenches 124 extended into an upper portion of hard mask 102. Preferably, the trench is etched through upper TEOS layer 104 and ARC layer 110 and sidewall spacers 116 are removed.

Figure 8A:
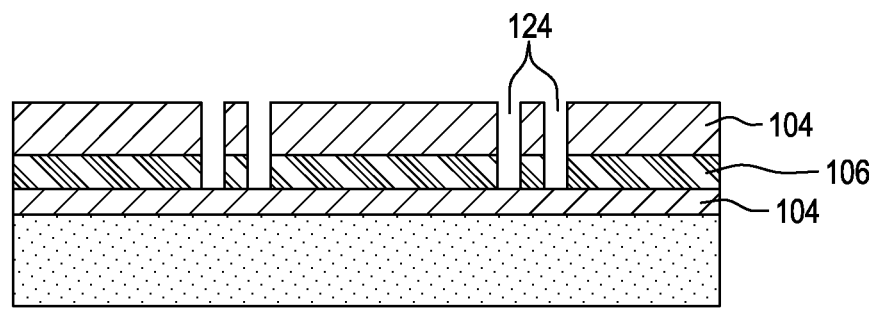
FIG. 8A depicts the trenches being etched further in the TiN layer and the OPL is removed in accordance with an embodiment of the present invention.

FIG. 8A depicts trenches 124 being etched further into TiN layer 106 and OPL 108 is removed in accordance with an embodiment of the present invention. Each of the aforementioned etching steps are preferably highly selective and automatically stop when reaching the next layer. In another embodiment, the depth of each etch may be determined by timing. The etching process is preferably a plasma etch, though various wet and dry etching processes may be used.

Figure 8B:
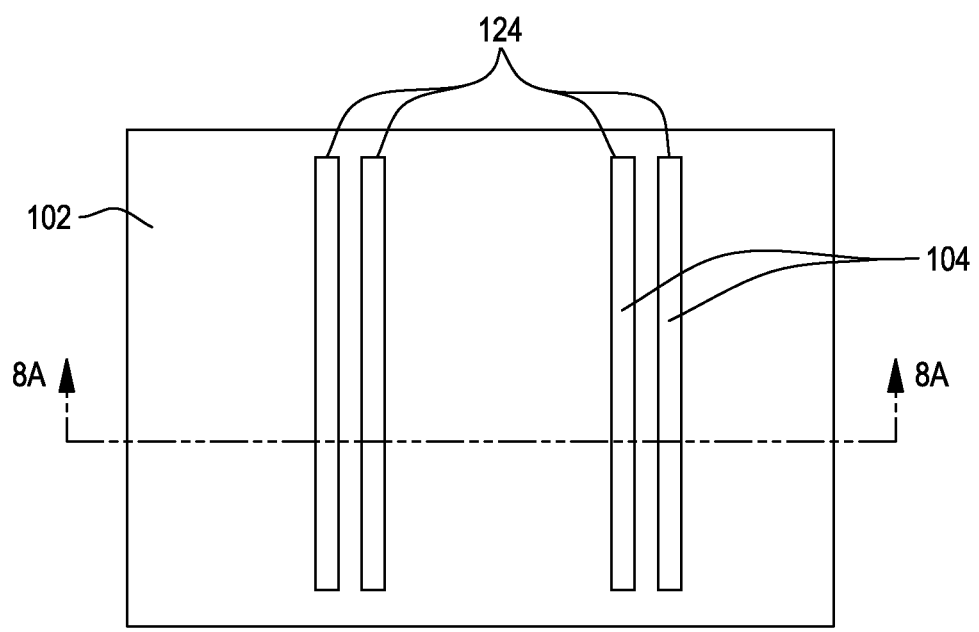
FIG. 8B illustrates the trenches of FIG. 8A from a top down view.

FIG. 8B illustrates the trenches of 8A from a top down view. Here, the top most portion shown is the upper surface of hard mask 102. Trenches 124 are etched into hard mask 102 extending less than the entire depth of hard mask 102, preferably stopping at bottom TEOS layer 104. In another embodiment, a leftmost and rightmost trench may be added, wherein the trenches do not intersect cross-section 8A, and correspond to the leftmost and rightmost spaces between sidewall spacers 116 blocked in the cross-section view of FIG. 5 by patterned photoresist 122.

Figure 9A:
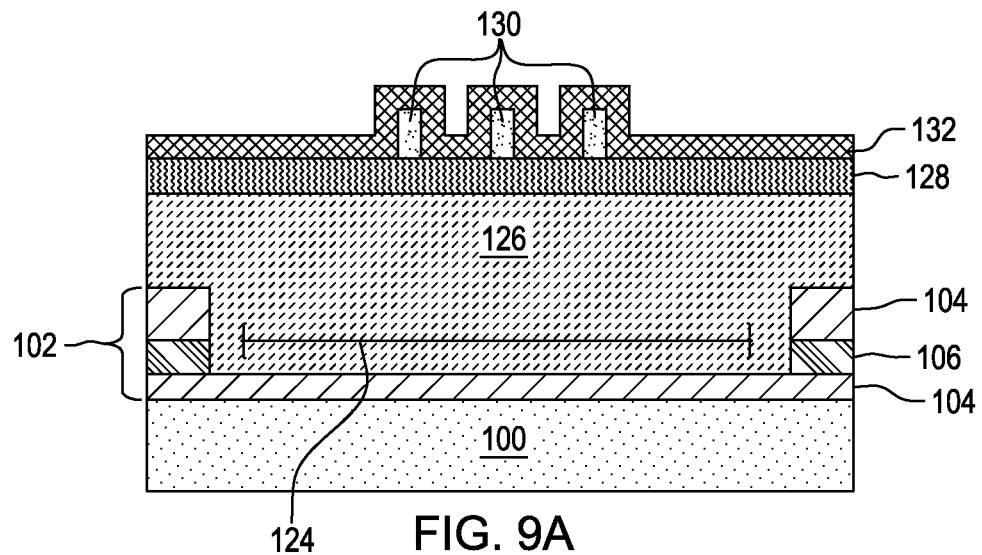
FIG. 9A is a cross-sectional view of the semiconductor structure with an OPL formed on what remains of the hard mask, an ARC layer formed on the OPL, a patterned photoresist formed on the ARC layer, and a conforming layer formed evenly over the patterned photoresist, in accordance with an illustrative embodiment.

FIG. 9A is a cross-sectional view of the semiconductor structure with OPL 126 formed on what remains of hard mask 102, ARC layer 128 formed on OPL 126, patterned photoresist 130 formed on ARC 128, and conforming layer 132 formed evenly over photoresist 130, in accordance with an illustrative embodiment. Patterned photoresist 130 (mandrels to deposit conforming layer 132 around) is preferably formed orthogonal to trenches 124. The shown cross-section is actually along one of the trenches 124 that is filled with OPL 126 in between upper TEOS layer 104 and TiN layer 106.

Figure 9B:
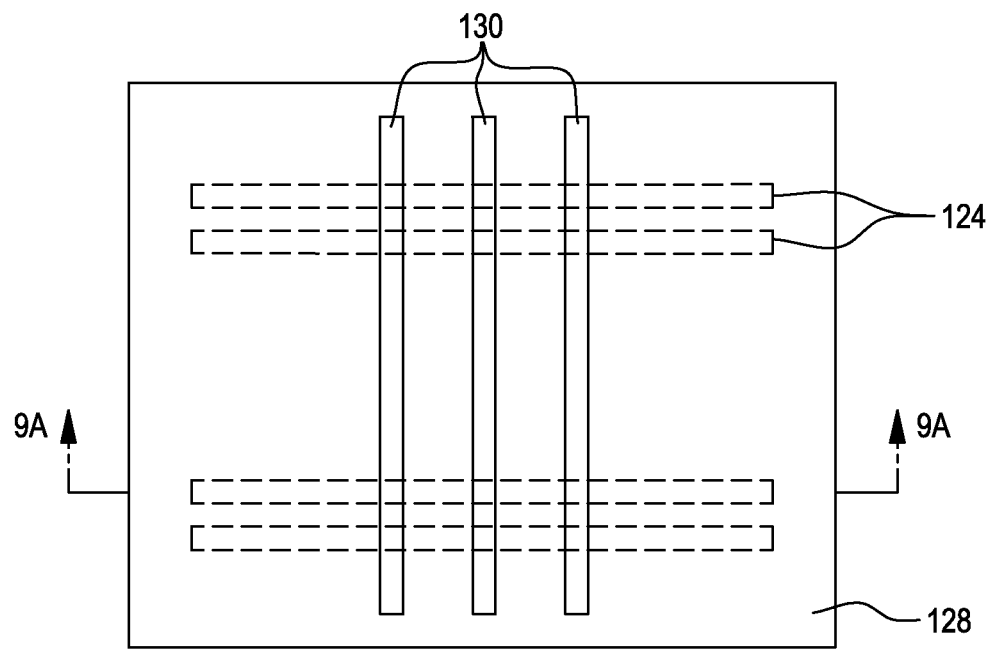
FIG. 9B shows the patterned photoresist from a top down view.

FIG. 9B shows the patterned photoresist from a top down view. Here, patterned photoresist 130 is formed across a surface of ARC layer 128, while beneath these layers, trenches 124, from FIG. 8B, are etched into hard mask 102 (not shown) orthogonal to patterned photoresist 130.

Figure 10:
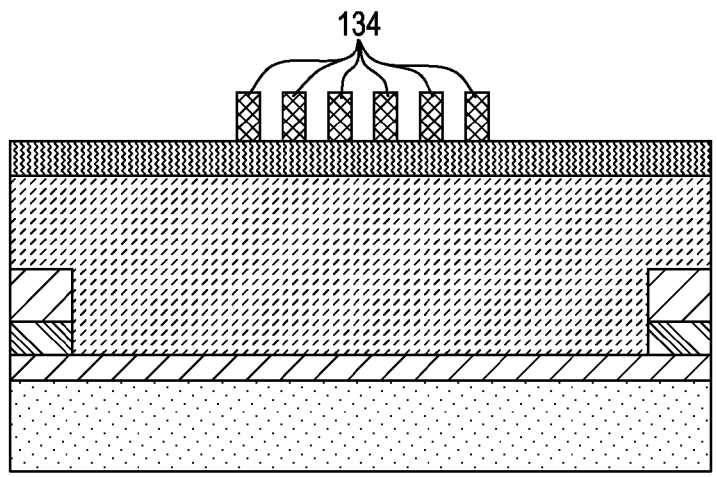
FIG. 10 illustrates the conversion of the conforming layer to sidewall spacers, in accordance with an embodiment of the present invention.

FIG. 10 illustrates the conversion of conforming layer 132 to sidewall spacers 134. This process may be the same process used and described for the creation of sidewall spacers 116.

Figure 11:
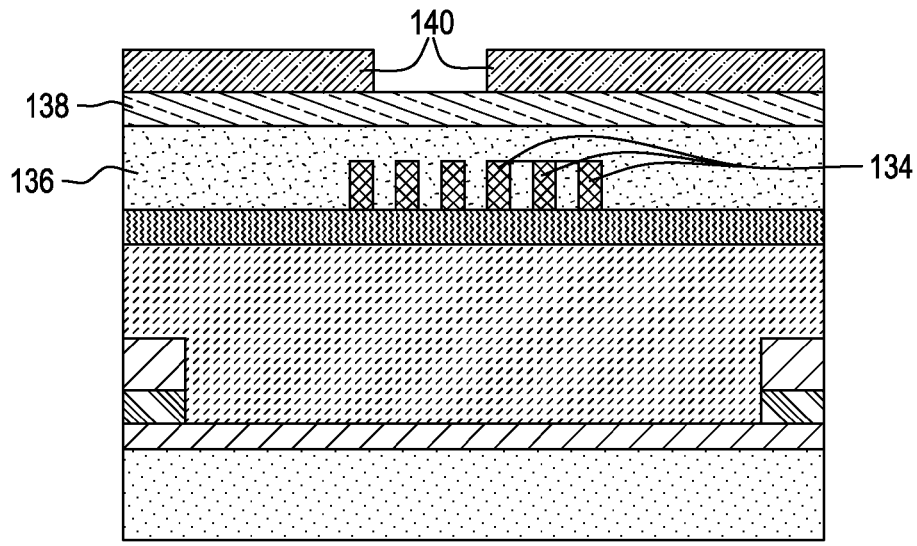
FIG. 11 depicts the forming of another OPL, another ARC, and another patterned photoresist, to create a blocking lithography to cut away unnecessary features of the image created by the sidewall spacers in accordance with an embodiment of the present invention.

FIG. 11 depicts the forming of another OPL 136, another ARC 138, and another patterned photoresist 140, to create a blocking lithography to cut away unnecessary features of the image created by sidewall spacers 134.

Figure 12:
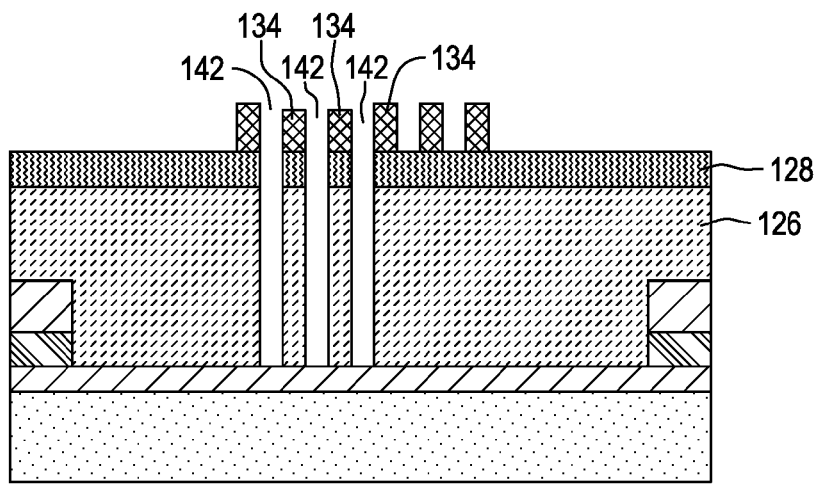
FIG. 12 illustrates the resulting etch of trenches through the lower OPL and ARC layer in accordance with an embodiment of the present invention.

FIG. 12 illustrates the resulting etch of trenches 142 through OPL 126 and ARC layer 128. Trenches 142 are defined by the spaces between sidewall spacers 134, as seen through patterned photoresist 140. The additional OPL 136, ARC 138, and patterned photoresist 140 are removed.

In the depicted embodiment, patterned photoresist 130, and hence trenches 142, are orthogonal to trenches 124. In another embodiment, trenches 142 may be formed at any angle (e.g., 45 degrees) that intersect trenches 124.

Figure 13A:
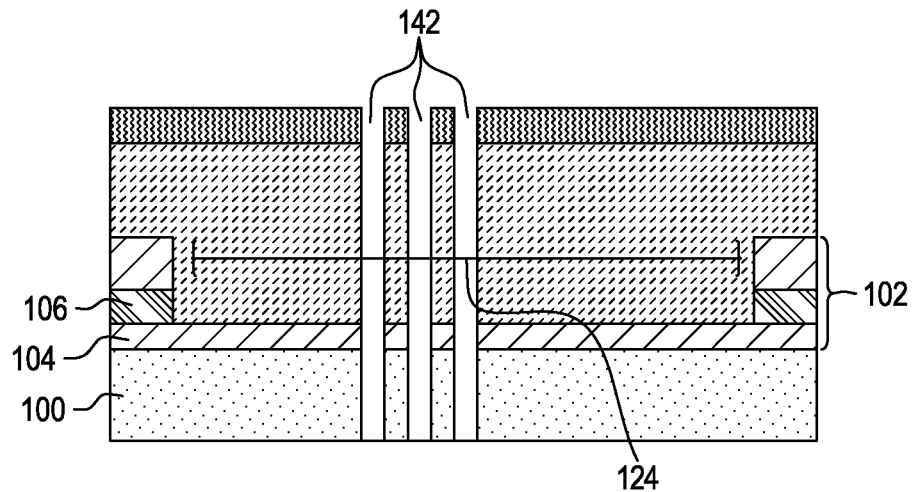
FIG. 13A depicts the formation of via holes through the dielectric layer in accordance with an illustrative embodiment of the present invention.

FIG. 13A depicts the formation of via holes through the dielectric layer. A selective etch is performed, wherein the etch passes through TEOS 104 and fully or partially through the dielectric 100, but not through TiN layer 106. This results in the etch going all the way through hard mask 102 only at the intersection of trenches 124 and 142. The etch may continue through the intersection points through dielectric 100 in the same or a subsequent step. The resulting via holes are defined by widths of intersecting trenches 124 and 142, which are preferably both sub-lithographic features. Additionally, the use of the sub-lithographic trenches, may also produce via holes with sub-lithographic pitch.

Figure 13B:
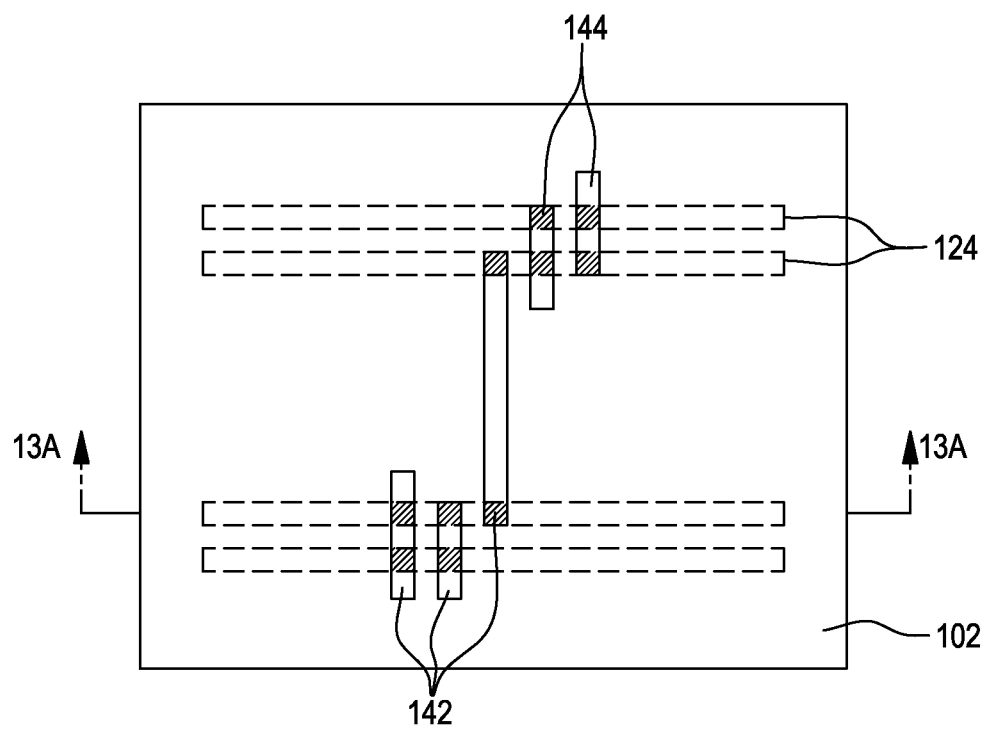
FIG. 13B depicts a top down view of the trenches of FIG. 13A etched into the semiconductor structure.

Referring now to FIG. 13B, a top down view is depicted of trenches 142 of FIG. 13A etched into the semiconductor structure. Trenches 142 are etched into hard mask 102. Where trenches 142 intersect with trenches 124 beneath them, the intersection point continues through the hard mask 102 and may be used as a mask to etch via holes through dielectric 100 (not shown). Trenches 144 are depictions of additional intersecting trenches for forming self aligning via holes and correspond to the two rightmost spaces between sidewall spacers 134 which were partially blocked by patterned photoresist 140 in FIG. 11. The blocking lithography may merely shorten the lines where they are unnecessary and not remove them completely.

Figure 14:
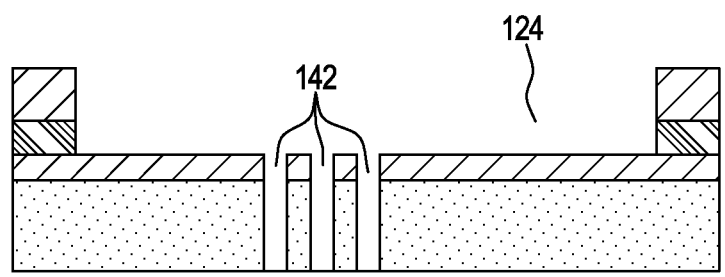
FIG. 14 shows the OPL removed and one of the lower trenches intersecting with upper trenches.

In FIG. 14, OPL 126 is removed, showing one of trenches 124 intersecting with trenches 142.

Figure 15:
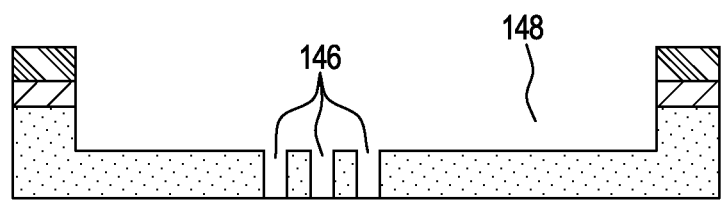
FIG. 15 depicts the lower trenches etched through the hard mask and into the dielectric to form a wiring path and self-aligned vias within the dielectric.

FIG. 15 depicts trenches 124 etched through hard mask 102 and into dielectric 100 to form a wiring path 148 and self-aligned vias holes 146 within dielectric 100. For simplicity, this last etch is preferably a timed etch, wherein the etch is stopped at some time prior to wiring path 148 going through the entire depth of dielectric 100. In another embodiment, an etch stop layer within dielectric 100 may be used. Hard mask 102 may be removed subsequent to this step.

Once the wiring paths and via holes are etched into the dielectric, metal deposition may take place. This involves the deposition of a conductive material into the via holes and wiring paths to create the wiring and vias for a metal layer of an integrated circuit. This is followed by a planarization step (such as a CMP process) to remove excess metal. Barrier materials may exist between the conductive material and the dielectric material. This entire process may be repeated to create multiple metallization layers.

Each respective figure, in addition to illustrating the structure of the present invention at various stages, also illustrates the respective steps of the method for patterning self-aligned vias in a dielectric.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the present invention. As used herein, the singular forms "a", "an" and "the" are intended to include the plural forms as well, unless the context clearly indicates otherwise.

Having described preferred embodiments of patterning self-aligning vias and wiring in a dielectric layer (which are intended to be illustrative and not limiting), it is noted that modifications and variations may be made by persons skilled in the art in light of the above teachings. It is therefore to be understood that changes may be made in the particular embodiments disclosed which are within the scope of the present invention as outlined by the appended claims.

What is claimed is:

1. A method for patterning a self-aligned via in a dielectric, the method comprising the steps of:
   forming a metal hard mask, having a metal containing layer between a first and second oxide layer, on top of a dielectric;
   etching a first trench through the first oxide layer and the metal containing layer, but not through the second oxide layer;
   etching a second trench, intersecting at least a portion of the first trench, selective to the metal containing layer such that the second trench stops at the metal containing layer except where the metal containing layer has been removed for forming the first trench thereby extending the second trench to expose a first area of the dielectric at the intersection of the first and second trench;
   etching the exposed first area of the dielectric to create a via hole extending into the dielectric;
   exposing a second area of the dielectric by re-etching the first trench to extend through the depth of the metal hard mask, wherein the exposed second area of the dielectric includes the via hole;
   etching the exposed area of the dielectric corresponding to the first trench to create a wiring path in the dielectric, wherein the wiring path extends partially through a depth of the dielectric and wherein the wiring path intersects the via hole; and
   depositing a conductive material into the via hole and wiring path of the dielectric to form a metal layer.

2. The method of claim 1, wherein the first trench is formed using one of: sidewall image transfer and pitch splitting.

3. The method of claim 1, wherein the second trench is formed using one of: sidewall image transfer and pitch splitting.

4. The method of claim 1, wherein the step of etching the first trench through the first oxide layer and the metal containing layer, but not the through the second oxide layer, comprises:
   etching the first oxide layer selective to the metal containing layer; and
   etching the metal containing layer selective to the second oxide layer.

5. The method of claim 1, wherein the metal containing layer comprises Titanium Nitride.

6. The method of claim 1, wherein dimensions of the via hole are defined by widths of the intersecting first and second trench.

7. A method for patterning self-aligned vias in a dielectric, the method comprising the steps of:
   forming a metal hard mask, having a metal containing layer between a first and second oxide layer, on top of a dielectric;
   etching a first set of trenches through the first oxide layer and the metal containing layer, but not through the second oxide layer;
   etching a second set of trenches, intersecting a plurality of the first set of trenches, selective to the metal containing layer such that the each of the second set of trenches stops at the metal containing layer except where the metal containing layer has been removed for forming the first set of trenches thereby extending each of the second set of trenches to expose a first area of the dielectric at intersections of trenches from the first and second set of trenches;
   etching the exposed first area of the dielectric to create a plurality of via holes extending into the dielectric;
   exposing a second area of the dielectric by re-etching the first set of trenches to extend through the depth of the metal hard mask, wherein the exposed second area of the dielectric includes the plurality of via holes;
   etching the exposed area of the dielectric corresponding to the first set of trenches to create wiring paths in the dielectric, wherein the wiring paths extend partially through a depth of the dielectric and wherein the wiring paths intersect the plurality of via holes; and
   depositing a conductive material into the plurality of via holes and wiring paths of the dielectric to form a metal layer.

8. The method of claim 7, wherein the first set of trenches are created using a patterning technique such that spacing between a plurality of the first set of trenches is on a sub-lithographic scale.

9. The method of claim 8, wherein the plurality of via holes are etched with a sub-lithographic pitch.

10. The method of claim 8, wherein the patterning technique is selected from the group consisting of sidewall image transfer and pitch splitting.

* * * * *